United States Patent [19]
Blankenbecler

[11] Patent Number: 5,953,162
[45] Date of Patent: Sep. 14, 1999

[54] SEGMENTED GRIN ANAMORPHIC LENS

[76] Inventor: Richard Blankenbecler, 974 Cottrell Way, Stanford, Calif. 94305-1012

[21] Appl. No.: 09/119,093

[22] Filed: Jul. 20, 1998

Related U.S. Application Data

[60] Provisional application No. 60/053,882, Jul. 28, 1997.

[51] Int. Cl.$^6$ ...................................................... G20B 3/00
[52] U.S. Cl. .......................... 359/653; 359/652; 359/654; 359/668; 359/669; 61/37; 61/38; 61/39; 61/41
[58] Field of Search ..................... 359/668, 669, 359/652, 653, 654; 65/37, 38, 39, 41

[56] References Cited

U.S. PATENT DOCUMENTS

| | | | |
|---|---|---|---|
| 5,200,858 | 4/1993 | Hagerty et al. .................. | 359/652 |
| 5,236,486 | 8/1993 | Blankenbecler et al. ............ | 65/61 |
| 5,262,896 | 11/1993 | Blankenbecler ................. | 359/652 |
| 5,541,774 | 7/1996 | Blankenbecler ................. | 359/653 |
| 5,582,626 | 12/1996 | Blankenbecler ................. | 65/37 |
| 5,617,252 | 4/1997 | Manhart et al. ................ | 359/653 |
| 5,689,374 | 11/1997 | Xu et al. ..................... | 359/652 |
| 5,703,722 | 12/1997 | Blankenbecler ................. | 359/653 |
| 5,796,525 | 8/1998 | Demperwolf et al. ............. | 359/653 |
| 5,815,318 | 9/1998 | Demperwolf et al. ............. | 359/653 |

*Primary Examiner*—Georgia Epps
*Assistant Examiner*—David N. Spector
*Attorney, Agent, or Firm*—Steven Mitchell

[57] ABSTRACT

A segmented GRIN anamorphic lens and a lens array using such lenses are provided. The lens has an optical axis and is composed of a plurality of segments. The interfaces between the segments are planes or wedges inclined at an angle to the optical axis. At least one segment has a predetermined axial index of refraction profile while the other segment may have either a predetermined homogeneous index of refraction or a predetermined radial index of refraction profile. The planar interface geometry and the index of refraction profiles are chosen to provide lenses with desirable optical properties. Spherical and cylindrical aberrations can be reduced or eliminated by appropriate choice of the index of refraction profile. The front and rear surfaces of the lens assembly can also be ground and polished into spherical shapes which act with the axial gradient interface to yield an anamorphic lens functionality.

17 Claims, 8 Drawing Sheets

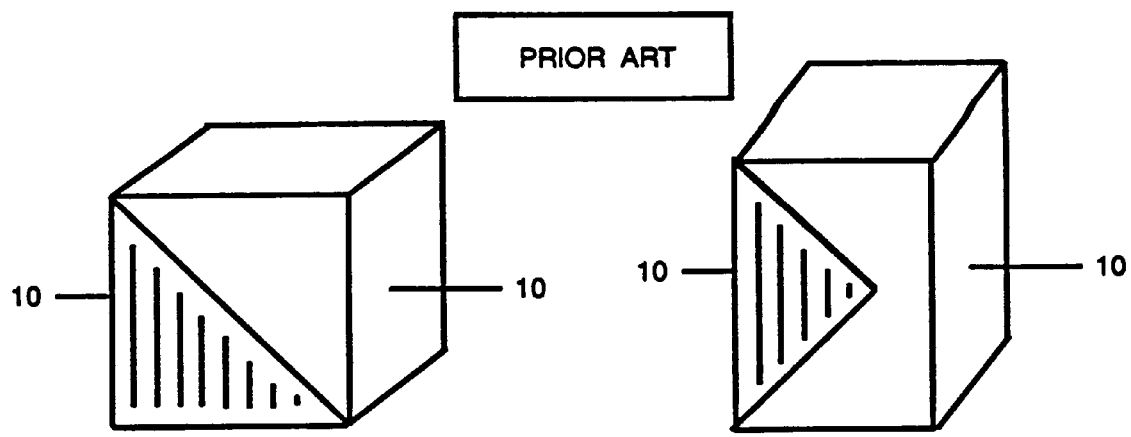
FIGURE 1 A
FIGURE 1 B
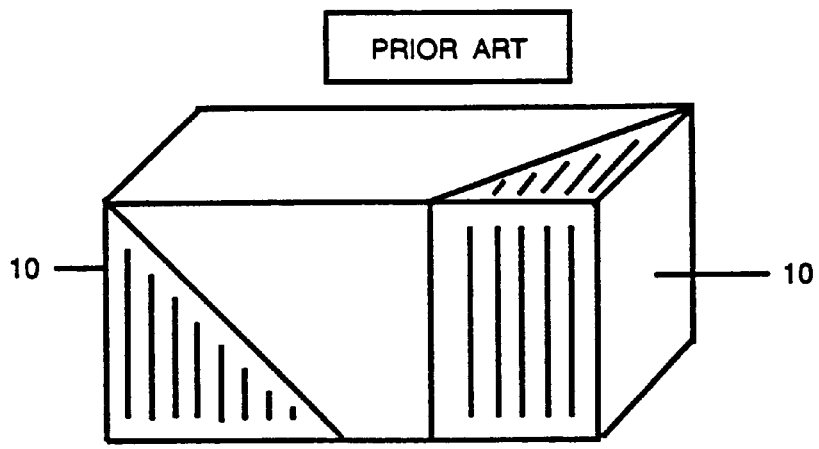
FIGURE 2 A
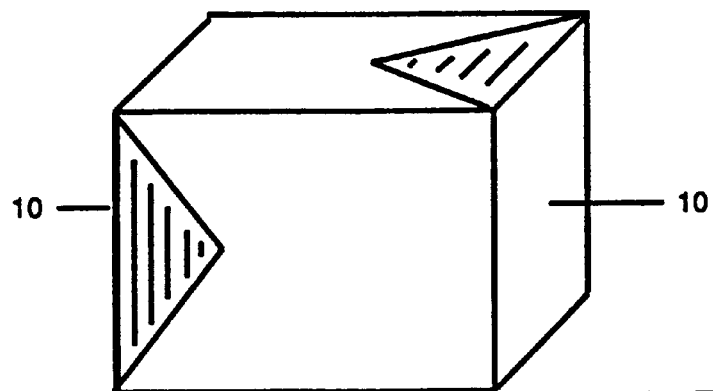
FIGURE 2 B

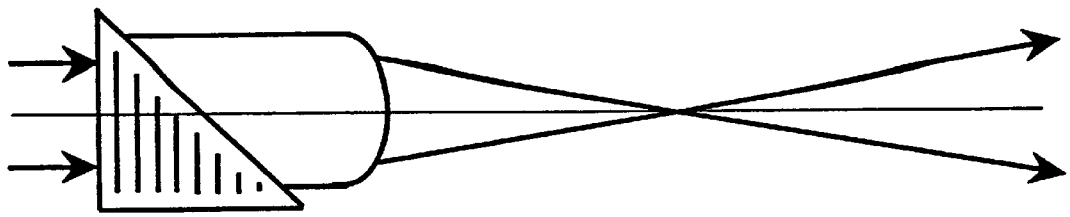
FIGURE 5A — SIDE VIEW of RAY TRACE — Converging GRIN
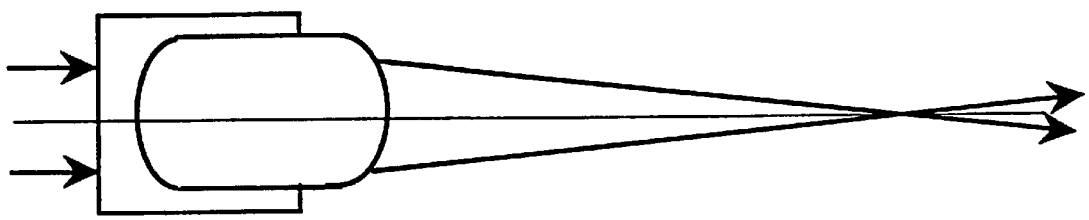
FIGURE 5B — TOP VIEW of RAY TRACE — Converging GRIN
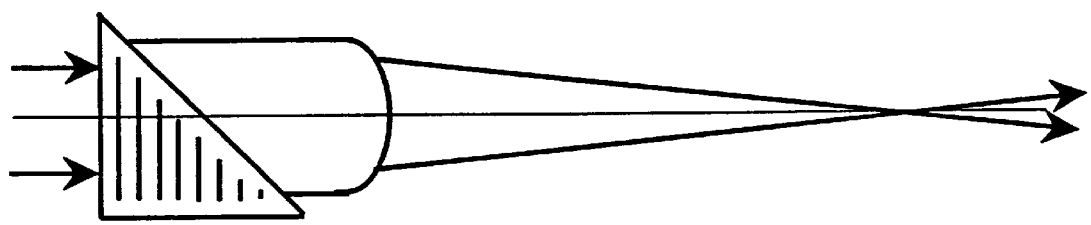
FIGURE 6A — SIDE VIEW of RAY TRACE — Diverging GRIN
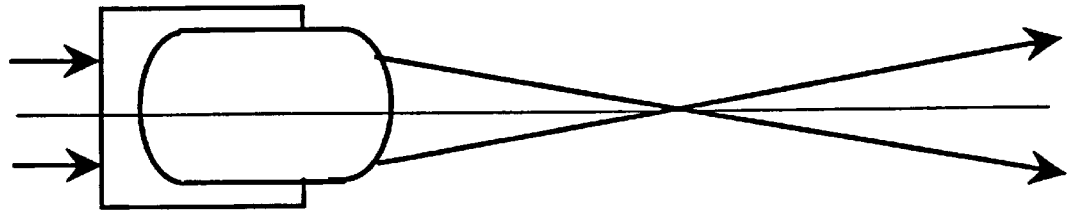
FIGURE 6B — TOP VIEW of RAY TRACE — Diverging GRIN

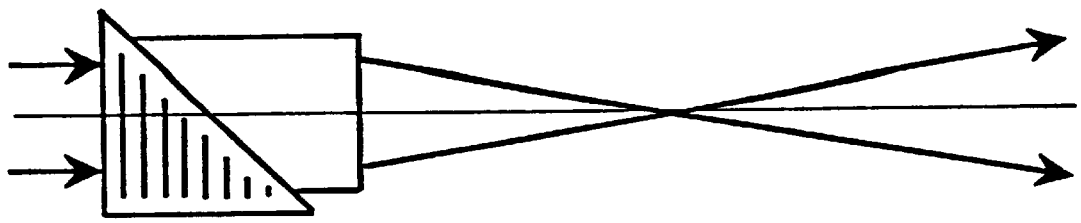
FIGURE 8 A -- SIDE VIEW of RAY TRACE -- Converging AXIAL
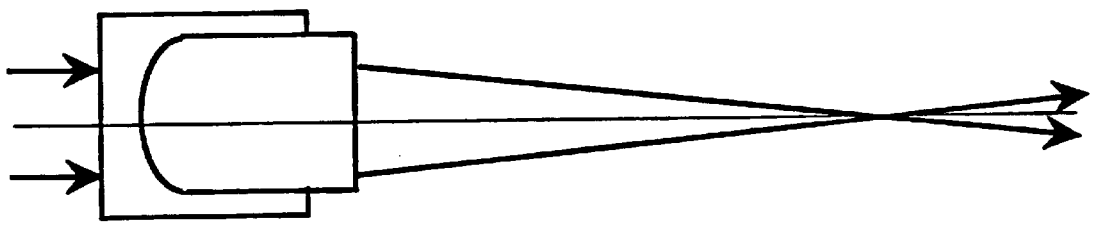
FIGURE 8 B -- TOP VIEW of RAY TRACE -- Converging AXIAL
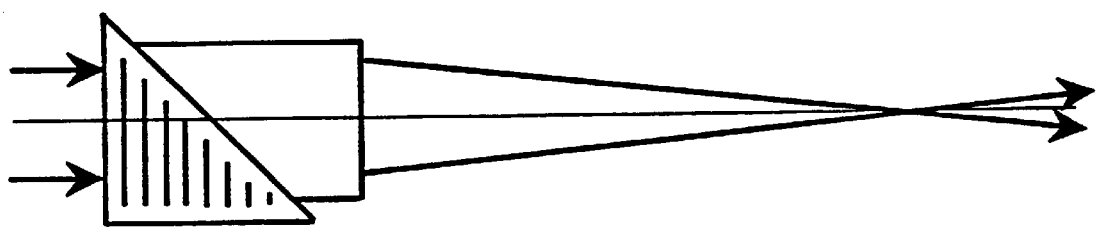
FIGURE 9 A -- SIDE VIEW of RAY TRACE -- Diverging AXIAL
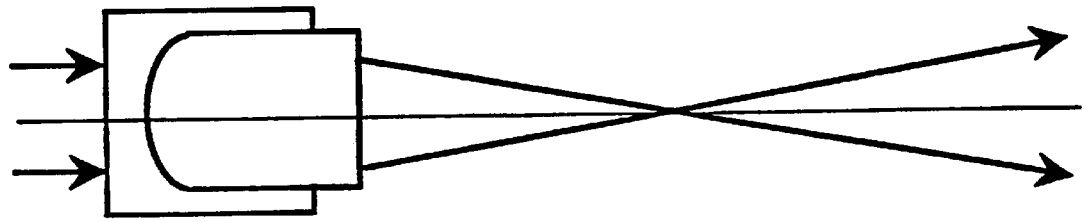
FIGURE 9 B -- TOP VIEW of RAY TRACE -- Diverging AXIAL

SEGMENTED GRIN ANAMORPHIC LENS

This application claims the benefit of U.S. Provisional Application No. 60/053,882, filed Jul. 28, 1997.

BACKGROUND OF THE INVENTION

1. Field of the Invention

The present invention relates generally to lenses, and more particularly to lenses formed from a plurality of segments at least one of which has an axial refractive index gradient.

2. Prior Art

A conventional lens with spherical surfaces and with a homogeneous index of refraction will not focus light perfectly; there will be spherical and chromatic aberrations. The latter aberrations may be canceled, for example, by using a lens doublet in which each lens has a unique chemical composition and therefore an index of refraction with its own dependence on the wave length of light. The chromatic aberrations can be reduced by cancellation between the two indices. The spherical aberrations can be eliminated by the expensive and difficult process of grinding a predetermined aspherical surface on the lens. It is also well known in the art that these aberrations can be eliminated by employing axial gradient lens blanks. An axial gradient lens is a lens which has an index of refraction profile which varies in one direction only, usually chosen to be the optical axis. The spherical surface on these lenses provide the optical power. The axial gradient index profile which is exposed by the curving surface allows the index of refraction to vary along the surface. This variation can be chosen to minimize the spherical aberrations of the lens system. These lenses with reduced aberrations can be used advantageously in a variety of optical systems, such as slide projectors, cameras, binoculars, and many other imaging devices; the number of lens elements required for a given task can be reduced as well as the weight and complexity of the system.

The blanks for the fabrication of such gradient lenses can be made by a variety of processes such as SOL-GEL, infusion, and diffusion. In particular, there is the controlled diffusion process that can produce macro lenses with a prescribable index of refraction axial profile. The fabrication of such axial gradient lenses by the controlled diffusion process is disclosed in U.S. Pat. No. 5,262,896, "Refractive Elements With Graded Properties and Methods for Making Same", to R. Blankenbecler, which patent is incorporated herein by reference. These axial gradient lenses are commercially available.

Lens elements with a radial gradient index are also commercially available from Gradient Lens Corporation of Rochester N.Y., and from Nippon Sheet Glass Company, Ltd., Hyogo, Japan. Radial gradient lens elements in larger diameters is available from Progressive Photonics of Redwood Shores, Calif. These lens are symmetric around the optical axis and the transverse focal lengths are the same. They cannot be used to produce a symmetrical output beam from an unsymmetrical source such as a laser diode. An simple and improved type of lens with this capability is highly desirable.

An anamorphic lens is a lens that has different optical properties in the two directions, normally called the x- and y-axis, transverse to the optical axis, usually termed the z-axis. For example, the focal lengths in the x and y direction have different values. Such anamorphic lenses are useful in several contexts. One of the more important applications involves laser diode beam manipulation. The emitted light from a laser diode is more divergent in one transverse axis than in the other. The beam behaves in one direction as though it originates from a different depth in the source material than in the other direction, a property known as astigmatism. Thus an anamorphic lens system is required to focus this astigmatic beam into a parallel symmetric beam which is more useful.

A lens design for coupling a laser diode to a multimedia fiber using anamorphic radial gradient-index components is described by J. M. Stagaman and D. T. Moore, "Laser diode to fiber coupling using anamorphic gradient-index lenses", Applied Optics, vol. 23, no. 11, pp. 1730–1734 (1984). These authors discuss the disadvantages and difficulties in the conventional approach of utilizing prisms and/or cylindrical lenses. Their suggested design for a lens system to be used with a laser diode source with astigmatism uses a gradient index lens with an elliptical profile. At this time, there is no commercial method to fabricate a general anamorphic lens in which each transverse dimension has its own independent index profile. A new type of lens that allows the commercial fabrication of a general anamorphic lens is highly desirable.

A monolithic anamorphic lens fabricated from at least three segments with at least two possessing axial gradients is described in U.S. Pat. No. 5,541,774, issued Jul. 30, 1996 to R. Blankenbecler, the present author. In this patent, hereafter denoted by "the '774 patent", a more complete discussion of anamorphic lenses and prior art is given. The '774 patent is incorporated herein by reference.

Multiple element anamorphic lens systems can be formed by combining traditional cylindrical lenses with conventional lenses possessing radial symmetry. However high quality cylindrical lens elements are expensive to fabricate due to the difficulty of grinding and polishing accurate cylindrical surfaces. Thus a new design for an anamorphic lens that contains a minimum of segments and simple surfaces such as planer and spherical, is highly desirable.

It is therefore an object of the invention to provide an improved type of anamorphic lens that is a cemented monolithic structure to simplify mounting and adjustment.

It is another object of the invention to provide a general anamorphic lens in which each transverse dimension can has its own independent optical parameters which can be varied over a large range.

It is a related object of the invention to provide a general anamorphic lens system which provides independent manipulation of a beam of light in two transverse orthogonal directions.

It is a further object of the invention to provide a general anamorphic lens that does not require cylindrical surfaces to be ground and polished to a high precision.

It is a further object of the invention to provide a design for a general anamorphic lens that can be easily fabricated into a multiple lens array.

SUMMARY OF THE INVENTION

The segmented axial gradient anamorphic lens of the invention provides a flexible framework for the lens designer to achieve many desirable optical functions. In particular, the difficulty of fabricating conventional cylindrical lenses contrasts with the simple planar and spherical surfaces required by the present invention.

In a preferred embodiment of the invention, a segmented GRIN anamorphic lens is provided having a front surface, a rear surface and an optical axis. The lens comprises a plurality of segments joined at one or more plane interfaces. The segments are clamped, cemented, or heat bonded to form a monolithic lens assembly. The surface of each interface forms an angle other than 90 degrees with the optical axis and at least one of the segments has a predetermined index of refraction profile chosen to achieve a desired optical function. Where the lens includes two segments, one segment has an axial gradient index of refraction. The second segment may have a homogeneous index of refraction and a spherical rear surface, or it may have a radial gradient index with a planar or a spherical rear surface.

The segmented GRIN anamorphic lens offers increased flexibility to the optical designer The optical power of the lens arises from two sources. An external spherical surface or a symmetric radial GRIN lens provides equal optical power to the transverse axes. The axial gradient along the angled planar interface provides optical power only along one of the transverse axes. Thus the combination performs as an anamorphic lens. In general, the use of segmented GRIN anamorphic lenses allows the fabrication of optical systems with increased performance at lower cost.

BRIEF DESCRIPTION OF THE DRAWINGS

The various features and advantages of the present invention may be more readily understood with reference to the following detailed description taken in conjunction with the accompanying drawings in which:

FIG. 1A is a segmented axial GRIN lens.

FIG. 1B is another form for a segmented axial GRIN lens.

FIG. 2A is three segment axial gradient anamorphic lens.

FIG. 2B is another form for a three segment axial gradient anamorphic lens.

FIGS. 5A and 5B are side and top views of a GRIN anamorphic lens of the invention with selected light rays.

FIGS. 6A and 6B are side and top views of a GRIN anamorphic lens of the invention with selected light rays.

FIGS. 8A and 8B are side and top views of a GRIN anamorphic lens of the invention with selected light rays.

FIGS. 9A and 9B are side and top views of a GRIN anamorphic lens of the invention with selected light rays.

DETAILED DESCRIPTION OF THE INVENTION

Figure 3:
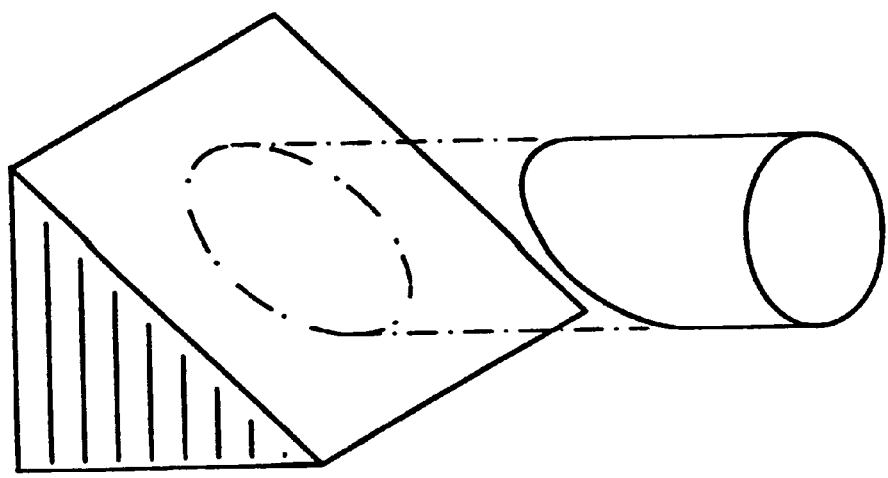
FIG. 3A is an exploded view of a two segment GRIN anamorphic lens of the invention with a wedge interface between an axial gradient segment and a homogeneous segment.
FIG. 3B is an assembled view of a two segment GRIN anamorphic lens of the invention.
FIG. 3C is a side view of assembled lens of the invention.
Figure 3:
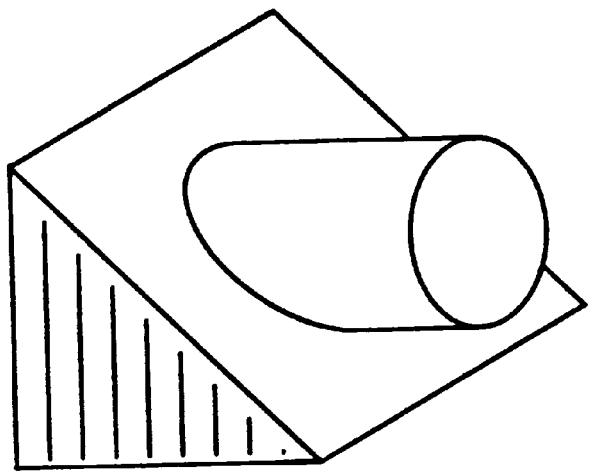
Figure 3:
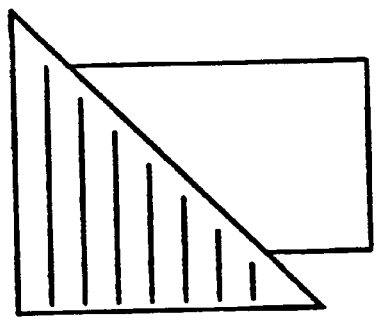

In accordance with the invention, a segmented GRIN anamorphic lens is provided. As used herein, a segmented lens is a lens composed of two or more close-fitting segments or sections. The contact surface between two segments is an interface. In addition, there is a front external surface and a rear external surface of the complete lens assembly. At least one of the segments contains an axial gradient in its index of refraction with the remaining having a homogeneous index of refraction or a radial gradient index. The chemical composition, or glass type, of each segment may be chosen independently subject only to being consistent with the desired optical performance. The final lens assembly has the segments clamped, cemented, heat bonded or otherwise joined to form a monolithic unit. The interface surfaces must be set at a finite angle to the optical axis. For purposes of this application, this means that the normal vector to the planar interface is not parallel the optical axis. In the wedge or cuneate form of the interface, each of the planar halves must be set at a finite and equal angles to the optical axis The front and rear surface of the assembly may be a planer or a spherical surface as demanded by the requirements of the design. These simple surfaces are easily fabricated using standard techniques well known in the art. For the use with a laser diode, the implementation will normally have a planar front surface.

Another novel feature of the invention is that the optical power and the optical function of the lens is provided by prescribing the index of refraction profile in the front segment, the radius of curvature of the rear spherical surface, and if the second segment is not homogeneous, its radial index profile. The difference in index between the two segments produces a desired bend in an incident light ray path if it strikes the interface at a non-normal angle. Thus the interfaces must be set at a finite angle to the optical axis. The resultant path of the light ray can be calculated from known laws of optics.

A two segment axial GRIN lens 12 of the '774 patent is depicted in FIG. 1A as a representative of segmented GRIN lenses This lens 12 functions as a cylindrical lens. The optical axis 10 is depicted in the figures. The front segment 14 has an axial gradient index profile while the second segment 16 has a constant index of refraction throughout. The interface 18 is planer. A similar axial GRIN lens 20 described the '774 patent is depicted in FIG. 1B. This lens has a wedge or cuneate interface 22.

A three segment axial GRIN lens 24 of the '774 patent is depicted in FIG. 2A as a further representative of segmented GRIN lenses. This lens 24 functions as an anamorphic lens. The optical axis 10 is depicted in the figures. The front segment 26 has an axial gradient index profile, the second segment 28 has a constant index of refraction throughout, and the third segment 30 contains an axial gradient index. The interfaces are planer and are at right angles to each other. A similar GRIN anamorphic lens 32 described in the '774 patent is depicted in FIG. 2B. This lens has a wedge or cuneate interface.

In FIGS. 3A, 3B, and 3C the simplest embodiment of the segmented GRIN anamorphic lens 34 is illustrated. The front segment 36 has an axial gradient index profile and the second segment 38 has a constant index of refraction. It is the difference in the value of the index of refraction in the two profiles at the point of intersection of a light ray with the planar interface 40 that determines the ray paths. As described in the '774 patent, the interface can be made to function as a cylindrical lens by the choice of a suitable index profile. The rear face 42 of the second section 38 has a spherical shape so that it functions as an ordinary lens. The rear surface 42 yields equal focal lengths in the two transverse directions. The interface 40 adds a cylindrical focusing effect. The combination acts as an anamorphic lens with the difference in the two focal lengths determined by the axial index of the first segment.

Figure 4:
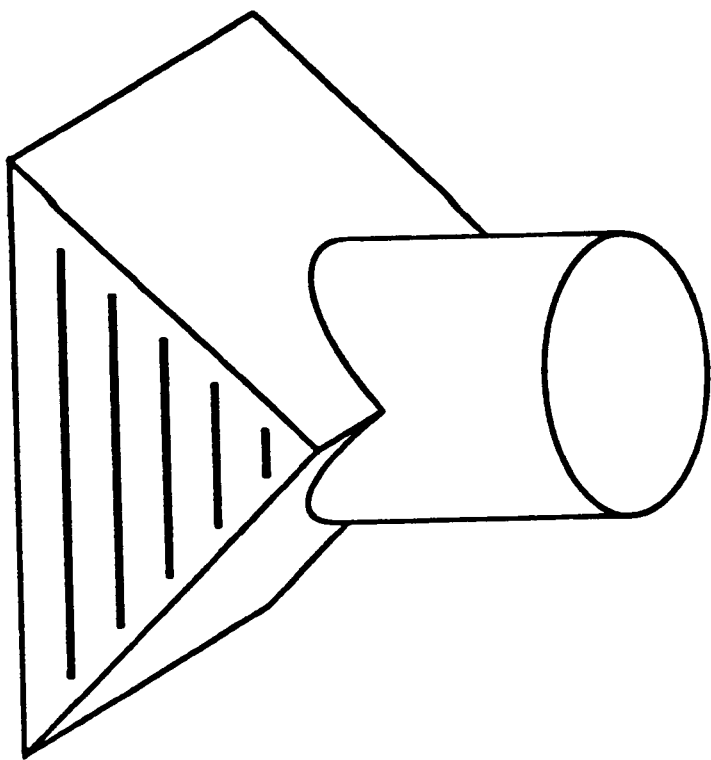
FIG. 4A is an assembled view of another form of a two segment GRIN anamorphic lens of the invention.
FIG. 4B is a side view of assembled lens of the invention.
Figure 4:
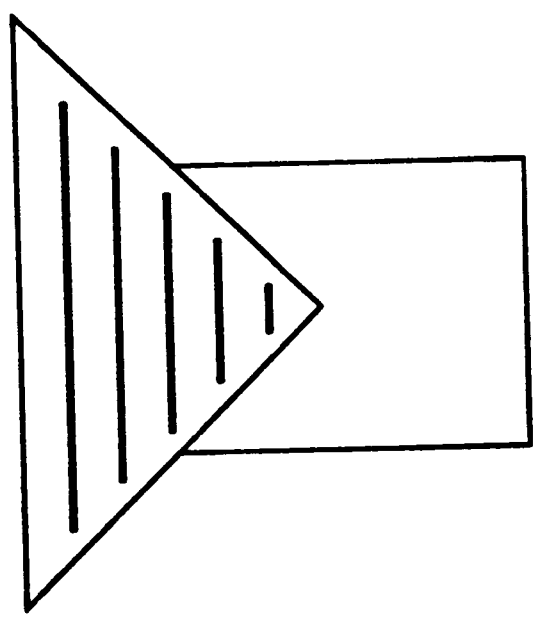

The interface between the axial GRIN segment and the homogeneous segment can also have a wedge or cuneate shape as depicted in FIGS. 4A and 4B. The axial gradient for both types of interfaces can be chosen to be convergent or divergent. The former is depicted in the two views shown in FIGS. 5A and 5B. The latter is depicted in the two views shown in FIGS. 6A and 6B.

Figure 7:
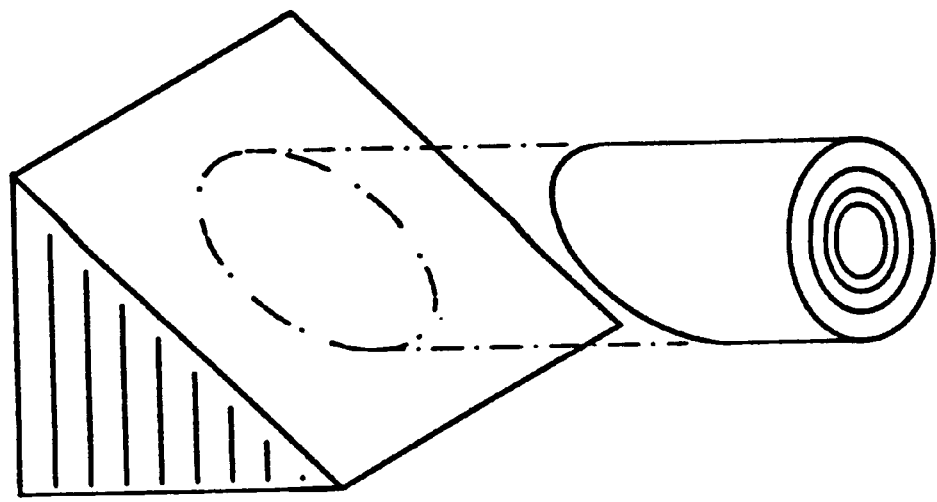
FIG. 7A is an exploded view of a two segment GRIN anamorphic lens of the invention with a wedge interface between an axial gradient segment and a radial gradient segment.
FIG. 7B is an assembled view of a two segment GRIN anamorphic lens of the invention.
FIG. 7C is a side view of assembled lens of the invention.
Figure 7:
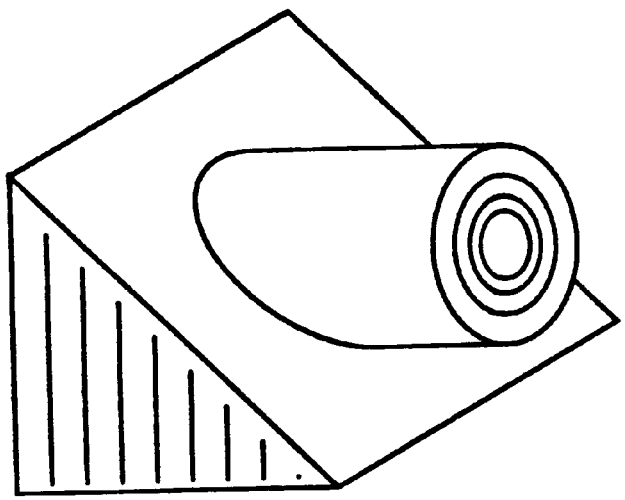
Figure 7:
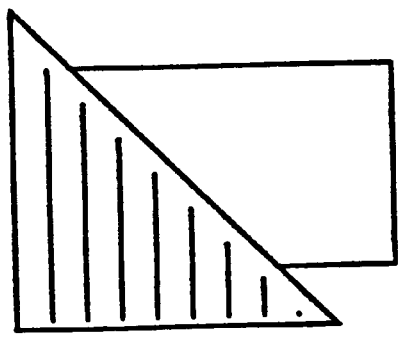

In FIGS. 7A, 7B, and 7C is an embodiment of the segmented GRIN anamorphic lens 50 with a second segment 52 that has a focusing radial index profile. The front segment 54 again has an axial gradient index profile. The interface can be made to function as a cylindrical lens by the choice of a suitable axial index profile in the first segment 54. The radial index profile in the second section 52 functions as a converging lens. The rear face 56 of the second section 52 may be planar or may have a spherical shape to add optical power to the lens assembly. The total optical function of the second segment 52 yields equal focal lengths in the two transverse directions. The interface adds a cylindrical focusing effect. The combination acts as an anamorphic lens. The interface can also have a wedge or cuneate shape or a conical shape with the radial gradient segment as well. The axial gradient for both types of interfaces can be chosen to be convergent or divergent. The former is depicted in the two views shown in FIGS. 8A and 8B. The latter is depicted in the two views shown in FIGS. 9A and 9B.

Figure 10:
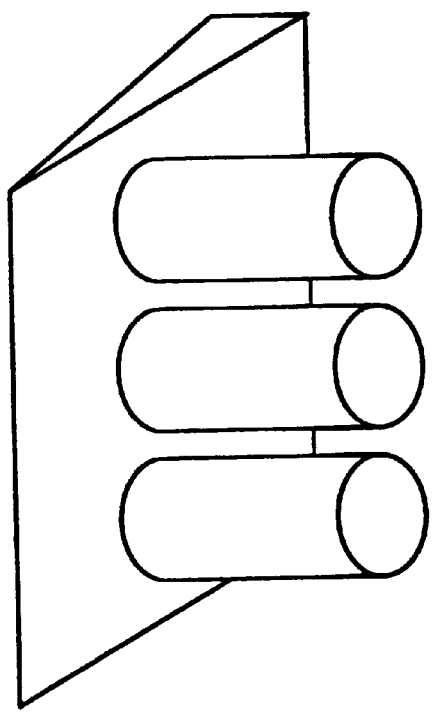
FIGS. 10A and 10B are two types of a GRIN anamorphic lens array of the invention.
Figure 10:
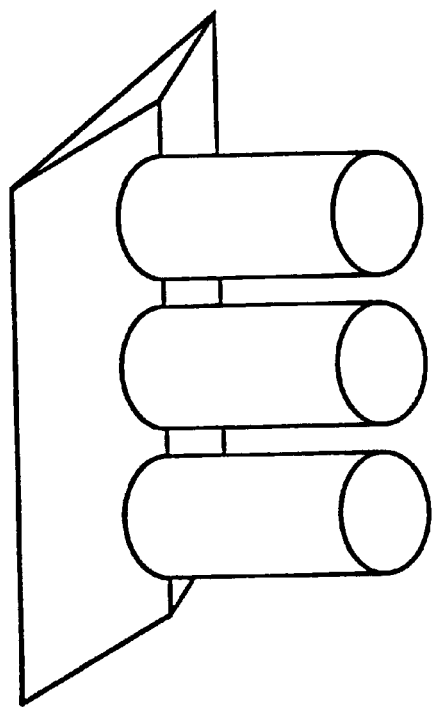

The form of the GRIN anamorphic lens design allows a lens array to be easily fabricated from the same type of elements. In FIGS. 10A and 10B two types of arrays 60, 62 are illustrated. These designs have a flat front surface 64 that can be directly mounted on another element of the system, such as the active light emitting surface of a laser diode. Each of the rear lenses can be placed over a separate emitting region of the laser diode surface.

THEORY AND PROTOTYPE OPTICAL DESIGN

The required shape of the axial index profile in the front segment can be determined from standard optical formulas for refraction. The axial GRIN wedge has a total height H and full base width of W. A horizontal ray at the height y (0<y<H) strikes the interface, sloped at an angle A, at the point z (0<z<W), where y=H*(1−z/W). The ray refracts and is bent by an angle d(z)

$$n(z)/n(0)=\sin [A+d(z)]/\sin [A+d(0)], \quad (1)$$

where the dependence of d(z) upon z is fixed by $$\tan d(z)=(H/2W)*(W-2*z)/(Fl-z), \quad (2)$$

which follows from requiring all rays to pass through a point on the optical axis at a distance Fl from the front face fixes. Thus the form and shape of n(z) is determined. For large focal length, Fl>>W, the index can be expanded as $$n(z)/n(0)=1+p1*z+p2*z*z+ \quad (3)$$

The following discussion uses the ZEMAX optical design code available from Focus Software of Tucson Ariz. This sample design provides the basics for selecting reasonable parameters for a segmented GRIN anamorphic lens of the invention. The front segment of the lens assembly contains an axial gradient index. This front segment is a wedge of total height of 20 mm a bottom length of 20 mm, and a wedge angle of 45 degrees. The second segment has a total height (diameter) of 20 mm and its rear face has a spherical surface with a radius of curvature of 50 mm. The second segment is BK7, a common and commercially available glass, with an index of refraction equal to 1.517 at a wave length of 0.5870 microns. The rear surface has a focal length of 93.5 mm The axial gradient index in the front segment was chosen to be $$n(z)=1.577-0.006*z. \quad (4)$$

Figure 11A:
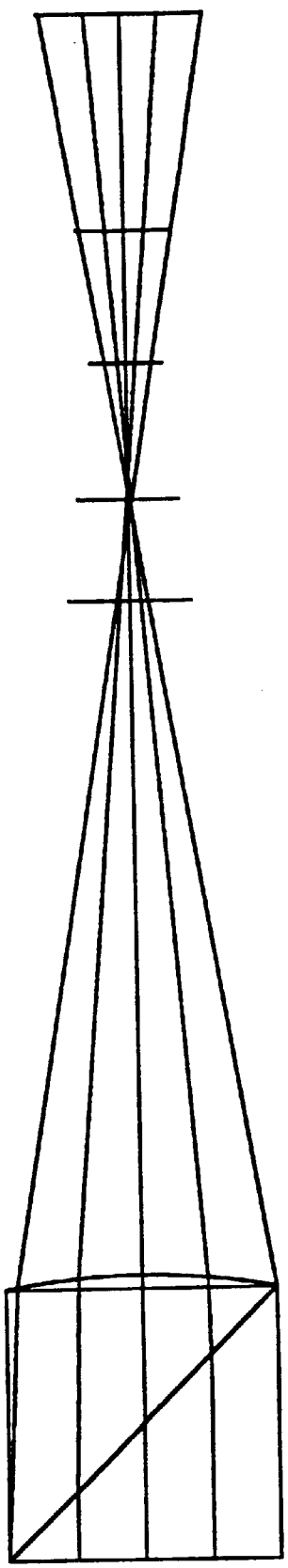
FIGS. 11A and 11B are a ZEMAX optical design drawing of the side and top view of the invention.
Figure 11B:
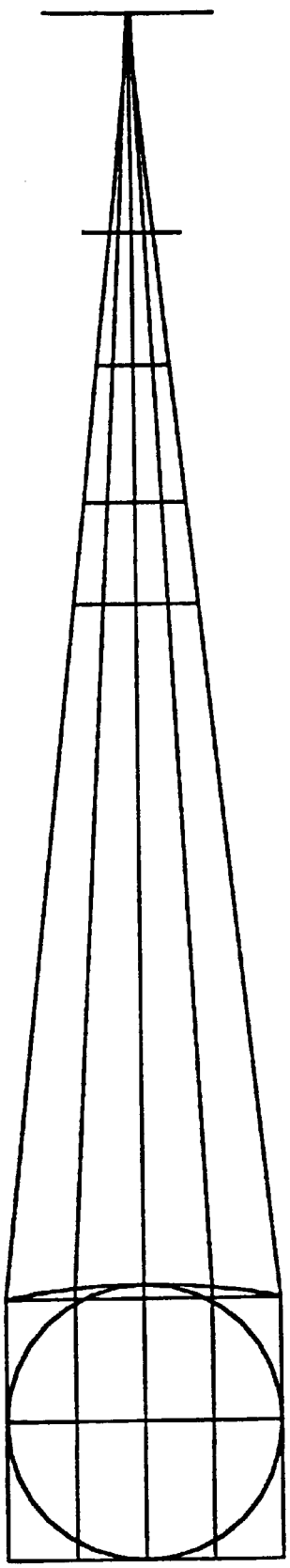

With these choices, the vertical focus was at a distance of 57.5 mm from the rear surface of the lens assembly as is shown in FIG. 11A. With these same parameters, the horizontal focus was at a distance of 93.5 mm from the rear surface as is shown in FIG. 11B. Note that the total change in index of refraction in the axial segment is 0.12. Axial gradient lens material with even larger changes in index are commercially available.

The vertical focus is shorter than the horizontal focus, clearly showing the cylindrical lensing effect of the axial front segment. This focus could be made even sharper by including higher powers of z in the expansion of the index profile, equation (1). For example, if the index profile is changed to $$n(z)=1.583-0.0055*z-0.000038*z*z, \quad (5)$$

the two foci are the same as reported above, but the vertical focus was much sharper. This index profile would form a line focus at a distance of Fl=253 mm from the front surface of the lens in the BK7 medium. Thus the front axial GRIN lens forms a virtual image for the spherical lens at the rear surface. Using the standard optical relation between the object, image, and focal distances, denoted by O, I, and F respectively:

$$n(BK7)/O+1/I=1/F, \quad (6)$$

where O=−Fl+20=−233 mm is negative, since it is a virtual object. The calculated focal length F is 58 mm, which is close to the ZEMAX optical design code computed value of 57.5 mm.

An optical designer can use the above formulas to calculate starting values for the parameters of the design. These parameters can be determined accurately by using a computer optical design code. Similar arguments can be used in the design utilizing a radial GRIN lens in place of the homogeneous spherical segment.

It should be understood that various alternatives to the embodiments of the invention described herein may be employed in practicing the invention. It is thus intended that the following claims define the scope of the invention and that structures and methods within the scope of these claims and their equivalents be covered thereby.

What is claimed is:

1. A segmented anamorphic lens having a front surface, a rear surface and an optical axis, said lens comprising:
    at least two segments joined with an interface between each pair of adjacent segments, each interface forming finite, non-normal angles with said optical axis;
    a first one of said segments having an axial index of refraction profile; and
    a second one of said segments having a radial index of refraction profile.

2. The lens of claim 1 wherein said front surface and said rear surface are each planar.

3. The lens of claim 1 wherein said front surface and said rear surface are each spherical.

4. The lens of claim 1 wherein said one of said surfaces is planar and the other of said surfaces is spherical.

5. The lens of claim 1 wherein said interface is a plane inclined at a predetermined angle from said optical axis.

6. The lens of claim 1 wherein said interface is a wedge with its sides inclined at a predetermined angle from said optical axis.

7. The lens of claim 1 wherein said interface is a cone with its sides inclined at a predetermined angle from said optical axis.

8. A segmented anamorphic lens having an optical axis, said lens comprising:

at least two segments joined with an interface between each pair of adjacent segments, each interface forming finite, non-normal angles with said optical axis;

a first segment including a front surface and an interface and having an axial index of refraction profile; and a second segment including a rear spherical surface and an interface and having an homogeneous index of refraction profile and joining said first segment at said interfaces which include at least one plane forming a non-normal angle with said optical axis.

9. The lens of claim 8 wherein said interfaces each include two planar surfaces forming mating wedge shapes.

10. The lens of claim 8 wherein said front surface is planar.

11. The lens of claim 8 wherein said front surface is spherical.

12. An anamorphic GRIN lens array having a plurality of parallel optical axes, said lens array comprising:

a front lens segment including a planar front surface and a rear interface surface forming a non-normal angle with each of said optical axes and having an axial index of refraction profile; and a plurality of rear lens segments each including a rear surface and an interface surface mating with said front segment interface surface.

13. The lens array of claim 12 wherein said rear lens segments each has a homogeneous index of refraction.

14. The lens array of claim 13 wherein each of said rear surfaces is spherical.

15. The lens array of claim 12 wherein said rear lens segments each has a radial index of refraction profile.

16. The lens array of claim 15 wherein each of said rear surfaces is spherical.

17. The lens array of claim 15 wherein each of said rear surfaces is planar.

* * * * *